(12) United States Patent
Kouno

(10) Patent No.: US 6,385,028 B1
(45) Date of Patent: May 7, 2002

(54) SURGE PREVENTING CIRCUIT FOR AN INSULATED GATE TYPE TRANSISTOR

(75) Inventor: Kenji Kouno, Gifu (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/334,741

(22) Filed: Jun. 17, 1999

(30) Foreign Application Priority Data

Jun. 19, 1998 (JP) .......................................... 10-173413
Apr. 23, 1999 (JP) .......................................... 11-116245

(51) Int. Cl.[7] ................................................ H02H 9/00
(52) U.S. Cl. .......................... 361/111; 361/56; 361/58; 361/100
(58) Field of Search .............................. 361/56, 58, 111, 361/100, 91.5, 91.6, 93.1; 257/328, 339, 355, 357

(56) References Cited

U.S. PATENT DOCUMENTS

| | | | | |
|---|---|---|---|---|
| 4,862,233 A | * | 8/1989 | Matsushita et al. | 257/328 |
| 4,893,158 A | * | 1/1990 | Mihara et al. | 257/341 |
| 5,079,608 A | * | 1/1992 | Wodarczyck | 257/355 |
| 5,115,369 A | | 5/1992 | Robb et al. | 361/93 |
| 5,128,823 A | * | 7/1992 | Fujimoto et al. | 361/93 |
| 5,162,699 A | * | 11/1992 | Fujihira | 257/140 |
| 5,181,095 A | | 1/1993 | Mosher et al. | 257/370 |
| 5,256,582 A | | 10/1993 | Mosher et al. | 437/31 |
| 5,304,802 A | * | 4/1994 | Kumagai | 257/328 |
| 5,365,099 A | | 11/1994 | Phipps et al. | 257/328 |
| 5,397,914 A | * | 3/1995 | Suda et al. | 257/570 |
| 5,444,595 A | | 8/1995 | Ishikawa et al. | 361/86 |
| 5,502,399 A | * | 3/1996 | Imai | 324/765 |
| 5,521,414 A | * | 5/1996 | Palara | 257/355 |
| 5,638,246 A | * | 6/1997 | Sakamoto | 361/103 |
| 5,691,557 A | * | 11/1997 | Watanabe | 257/357 |
| 5,973,359 A | * | 10/1999 | Kobayashi et al. | 257/328 |

FOREIGN PATENT DOCUMENTS

| | | |
|---|---|---|
| EP | 0060 635 | 9/1982 |
| EP | 0566 179 | 10/1993 |
| GB | 2 103 877 | 2/1983 |
| JP | 2-110976 | 4/1990 |

* cited by examiner

Primary Examiner—Stephen W. Jackson
(74) Attorney, Agent, or Firm—Harness, Dickey & Pierce, PLC

(57) ABSTRACT

A first Zener diode group, connected between drain and gate terminals of a power MOSFET, causes breakdown in response to a surge voltage applied to the drain terminal. A resistor, provided between the gate terminal of the power MOSFET and a gate control unit, prevents current from flowing from the drain terminal of the power MOSFET to the gate control unit in an event of the breakdown of the first Zener diode group. A second Zener diode group, connected between source and gate terminals of the power MOSFET, has a breakdown voltage lower than the gate withstand voltage of the power MOSFET. The second Zener diode group clamps the gate voltage against the breakdown of the first Zener diode group.

15 Claims, 11 Drawing Sheets

SURGE PREVENTING CIRCUIT FOR AN INSULATED GATE TYPE TRANSISTOR

BACKGROUND OF THE INVENTION

The present invention relates to a surge preventing circuit for an insulated gate type transistor, such as a power MOSFET (metal oxide semiconductor field-effect transistor) and an IGBT (insulated gate bipolar transistor), used for actuating an electric load. For example, a conventional insulated gate type transistor and its protecting circuit are disclosed in the U.S. Pat. No. 5,115,369.

SUMMARY OF THE INVENTION

An object of the present invention is to provide a surge preventing circuit for an insulated gate type transistor capable of accomplishing the charging operation through the gate terminal in a short time compared with the discharge time so that sufficient surge current flows in response to the activation of the insulated gate type transistor, thereby surely eliminating the parasitic bipolar operation and improving the durability against the quick surge caused by the static electricity or the like.

In order to accomplish this and other related objects, an aspect of the present invention provides a surge preventing circuit for an insulated gate type transistor with high-voltage and low-voltage terminals, one of which is connected to an electric load, and a gate terminal connected to a gate control unit. The surge preventing circuit comprises a first Zener diode having one end connected to the electric load through the one of the high-voltage and low-voltage terminals and the other end connected to the gate terminal of the insulated gate type transistor. The first Zener diode causes breakdown in response to a surge voltage applied to the one of the high-voltage and low-voltage terminals connected to the electric load. A resistor is connected between the gate terminal of the insulated gate type transistor and the gate control unit. The resistor prevents current from flowing from the one of the high-voltage and low-voltage terminals of the insulated gate type transistor to the gate control unit in an event of the breakdown of the first Zener diode. And, a second Zener diode of multiple stages is connected between the other of the high-voltage and low-voltage terminals and the gate terminal of the insulated gate type transistor. The second Zener diode clamps a gate voltage against the breakdown of the first Zener diode. A breakdown voltage of the second Zener diode is lower than a gate withstand voltage of the insulated gate type transistor.

With this arrangement, the first Zener diode causes breakdown when a surge voltage is applied to the high-voltage or low-voltage terminal of the transistor which is connected to the electric load. The resistor prevents the current from flowing from the electric load to the gate control unit via the high-voltage or low-voltage terminal of the transistor and the first Zener diode. The gate terminal is charged. When the gate voltage is increased to the threshold voltage of the transistor, the transistor is turned on. The surge current starts flowing so as to prevent the transistor from be broken.

By providing the second Zener diode between the gate terminal and the other of the high-voltage and low-voltage terminals of the insulated gate type transistor, it becomes possible to quicken the charging operation through the gate terminal and increase a reachable voltage level of the gate terminal through the charging operation. Such quick MOS transistor operation and the highly charged voltage make it possible to realize satisfactory MOS performance. Undesirable parasitic bipolar operation can be surely eliminated.

Thus, it becomes possible to improve the durability against the quick surge.

Preferably, the surge preventing circuit for an insulated gate type transistor of the present invention further comprises a third Zener diode having one end connected to an intermediate point between the gate control unit and the resistor and the other end connected to the other of the high-voltage and low-voltage terminals of the insulated gate type transistor.

According to this arrangement, the third Zener diode causes breakdown when a surge voltage is applied to the gate control unit. The surge current flows from the gate control unit to the other of the high-voltage and low-voltage terminals, thereby protecting the gate terminal of the insulated gate type transistor.

According to a preferred embodiment of the present invention, the first Zener diode is a first Zener diode group consisting of a plurality of serially connected Zener diodes having the same characteristics. And, the following equation is satisfied for the first Zener diode group.

$$n = BVp/Vzd$$

where "n" represents the total number of the Zener diodes constituting the first Zener diode group, "BVp" represents an expected breakdown voltage of the insulated gate type transistor, and "Vzd" represents a withstand voltage of one diode constituting the first Zener diode group.

According to the preferred embodiment of the present invention, the second Zener diode is a second Zener diode group consisting of a plurality of serially connected Zener diodes having the same characteristics. And, the following equation is satisfied for the second Zener diode group.

$$m = BVg/Vzd$$

where "m" represents the total number of the Zener diodes constituting the second Zener diode group, "BVg" represents the gate withstand voltage of the insulated gate type transistor, and "Vzd" represents a withstand voltage of one diode constituting the second Zener diode group.

It is further preferable that the resistor connected between the gate terminal of the insulated gate type transistor and the gate control unit has a resistance value Rg satisfying the following relationship $$Rg > \sqrt{r^2 + \left(\frac{1}{2\pi f C_{iss}}\right)^2}$$

where "r" represents a sheet resistance of the gate terminal of the insulated gate type transistor, "f" represents a frequency at which a maximum spectrum intensity is obtained when an objective surge waveform is subjected to the Fourier transformation, and "Ciss" represents a gate input capacitance of the insulated gate type transistor.

It is also preferable that the resistor connected between the gate terminal of the insulated gate type transistor and the gate control unit has a resistance value larger than a quarter of a gate input impedance of the insulated gate type transistor when an objective surge is applied.

BRIEF DESCRIPTION OF THE DRAWINGS

The above and other objects, features and advantages of the present invention will become more apparent from the following detailed description which is to be read in conjunction with the accompanying drawings, in which.

DESCRIPTION OF THE PREFERRED EMBODIMENTS

Related Circuit Arrangement Prior to the detailed description of the preferred embodiments of the present invention, a fundamental circuit arrangement relating to the present invention is explained.

Figure 13:
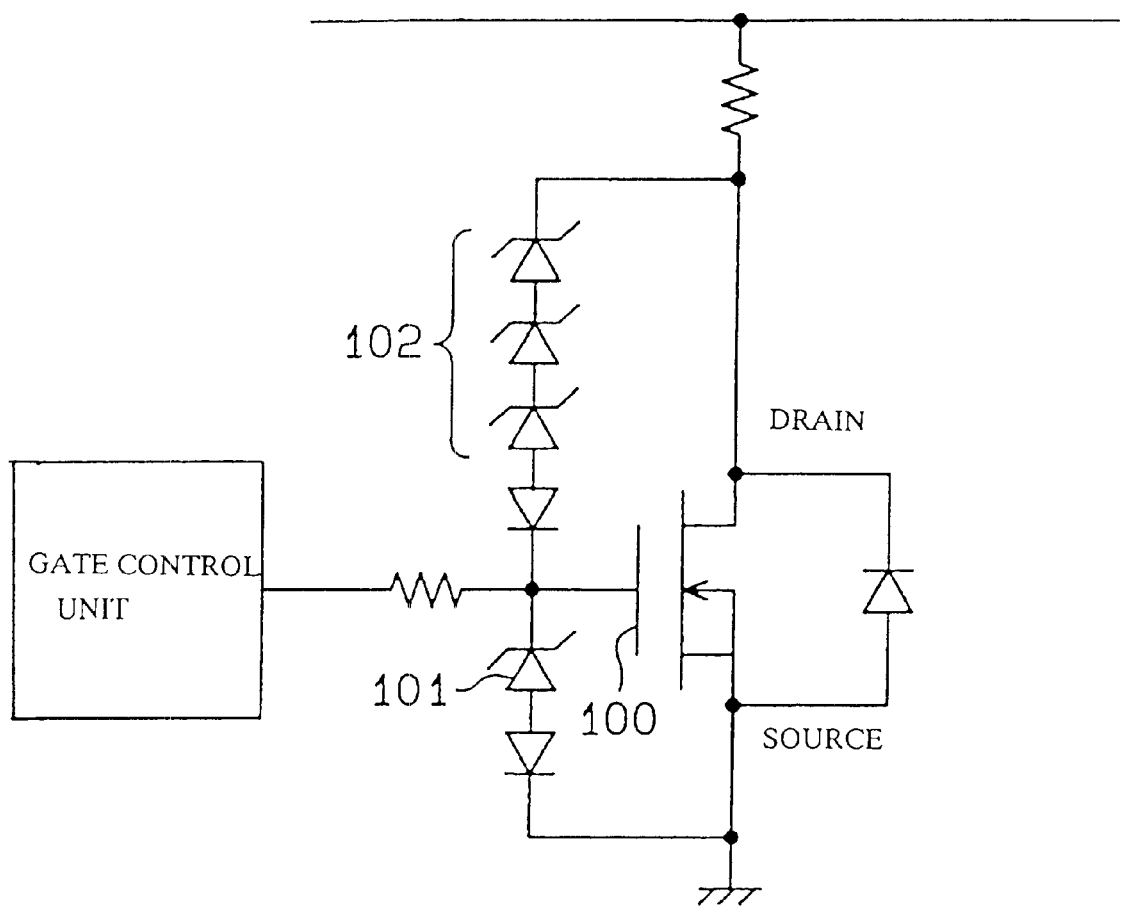
FIG. 13 is a diagram showing a fundamental load actuating circuit relating to the present invention.

FIG. 13 shows a surge preventing circuit for a MOSFET 100 which is a power device for actuating an L load (i.e., inductive load). A Zener diode 101 is connected between a gate terminal and a source terminal of the MOSFET 100 to protect the gate terminal. A Zener diode 102 is connected between a drain terminal and the gate terminal of the MOSFET 100 to clamp the gate voltage. According to this arrangement, a surge voltage applied to the drain terminal is absorbed by causing breakdown in the Zener diode 102. A withstand voltage (corresponding to the stage number) of the gate-source Zener diode 101 is, for example, 1 stage equivalent to approximately 8 volts of a gate driving voltage in an ordinary circuit. A withstand voltage of the drain-gate Zener diode 102 is set to be smaller than a withstand voltage between the source and drain terminals of the MOSFET 100. For example, an appropriate withstand voltage of the Zener diode 102 is 40 volts equivalent to 5 stages when the withstand voltage of MOSFET 100 is 60 volts.

The L load surge has a relatively long operation time in the order of several milliseconds. When the L load surge is applied, the Zener diode 102 causes breakdown and the gate terminal of the MOSFET 100 is charged until the gate voltage is increased to a threshold voltage Vth. When the gate voltage reaches the threshold voltage Vth, the MOSFET 100 is turned on to start its operation. As a result, the surge current flows uniformly through a channel of the MOSFET 100. It becomes possible to increase the durability against the L load surge compared with a case where the Zener diode 102 is not provided.

On the other hand, discharge of static electricity causes a relatively quick surge in the order of nanoseconds. When the electrostatic surge is applied to the MOSFET 100, the Zener diode 102 causes the breakdown. However, the charging operation through the gate terminal of the MOSFET 100 cannot be sufficiently accomplish due to short operation time of the quick surge. The gate terminal is thus insufficiently biased. In other words, surge current flows due to avalanche breakdown in the internal diode of the MOSFET 100. In this case, the MOSFET 100 may be broken when a parasitic bipolar transistor is turned on.

Preferred Embodiments

Preferred embodiments of the present invention will be explained hereinafter with reference to attached drawings. Identical parts are denoted by the same reference numerals throughout the views.

Figure 1:
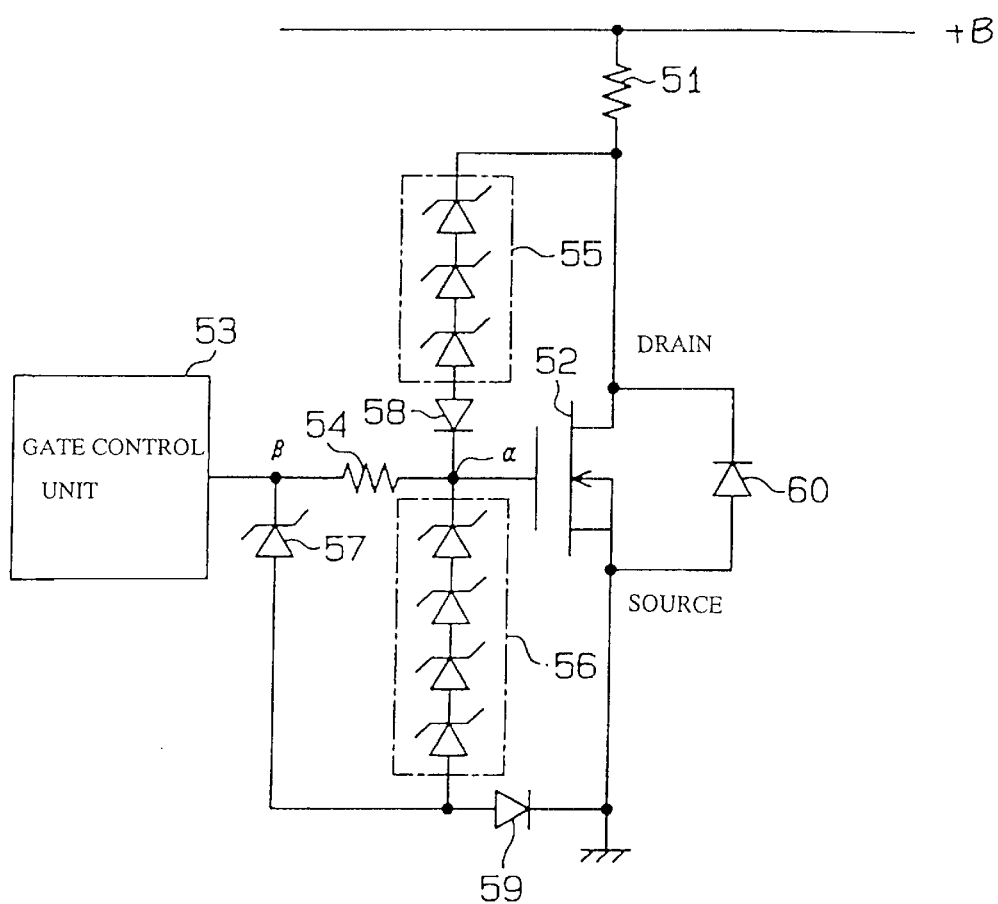
FIG. 1 is a diagram showing a load actuating circuit in accordance with a preferred embodiment of the present invention.

FIG. 1 is a load actuating circuit in accordance with a preferable embodiment of the present invention. An apparatus incorporating this load actuating circuit can be installed in an automotive vehicle controller. A power source for the load actuating circuit is a vehicle battery of 18 volts. The load actuating circuit comprises an electric load 51, a power MOSFET 52, and a gate control unit 53. The power MOSFET 52 has a source terminal grounded and a drain terminal connected to the electric load 51. The gate control unit 53 generates an output for controlling the gate potential of the power MOSFET 52. When a control signal having a potential higher than a threshold voltage of the power MOSFET 52 is applied to the gate terminal, the power MOSFET 52 is turned on to activate the electric load 51. Furthermore, the load actuating circuit comprises a surge preventing circuit consisting of a resistor 54 and a plurality of diodes 55 to 59 for protecting the power MOSFET 52.

Hereinafter, the surge preventing circuit for the power MOSFET 52 will be explained in greater detail.

Figure 2:
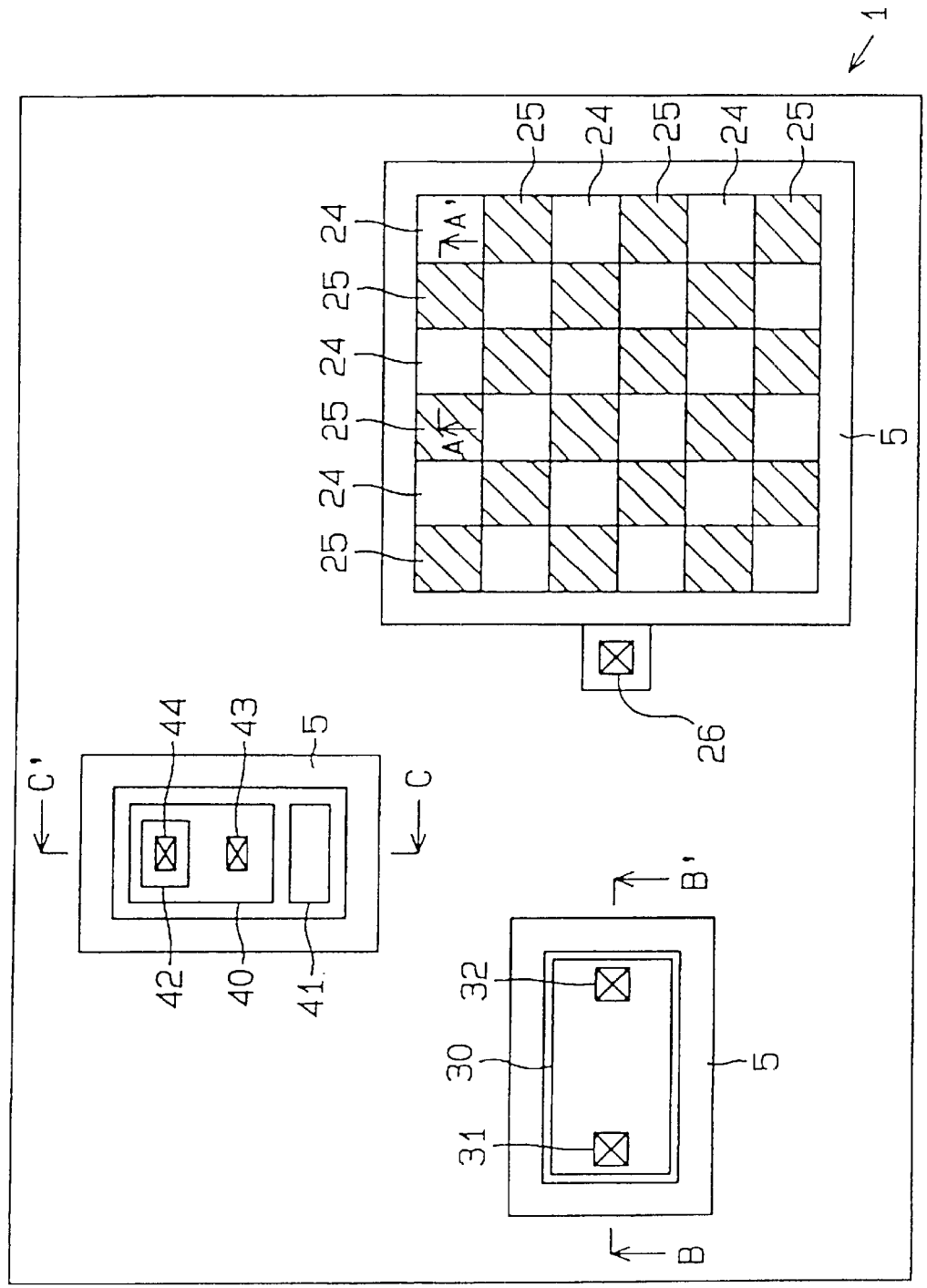
FIG. 2 is a plan view showing a practical arrangement of an laterally double diffused MOSFET, Zener diodes and a resistor of the load actuating circuit in accordance with the preferred embodiment of the present invention.
Figure 3:
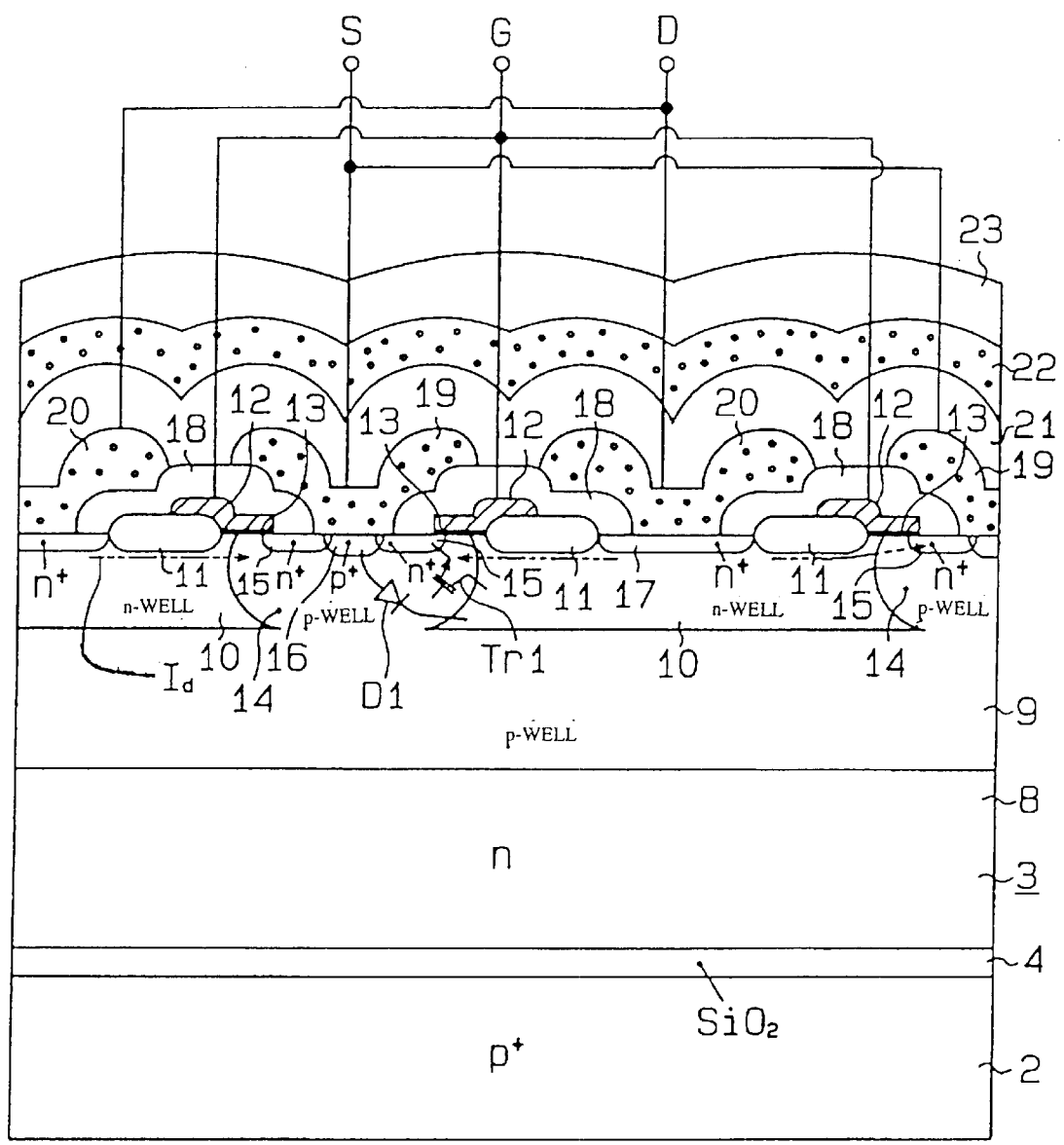
FIG. 3 is a cross-sectional view taken along a line A—A' of FIG. 2.
Figure 4:
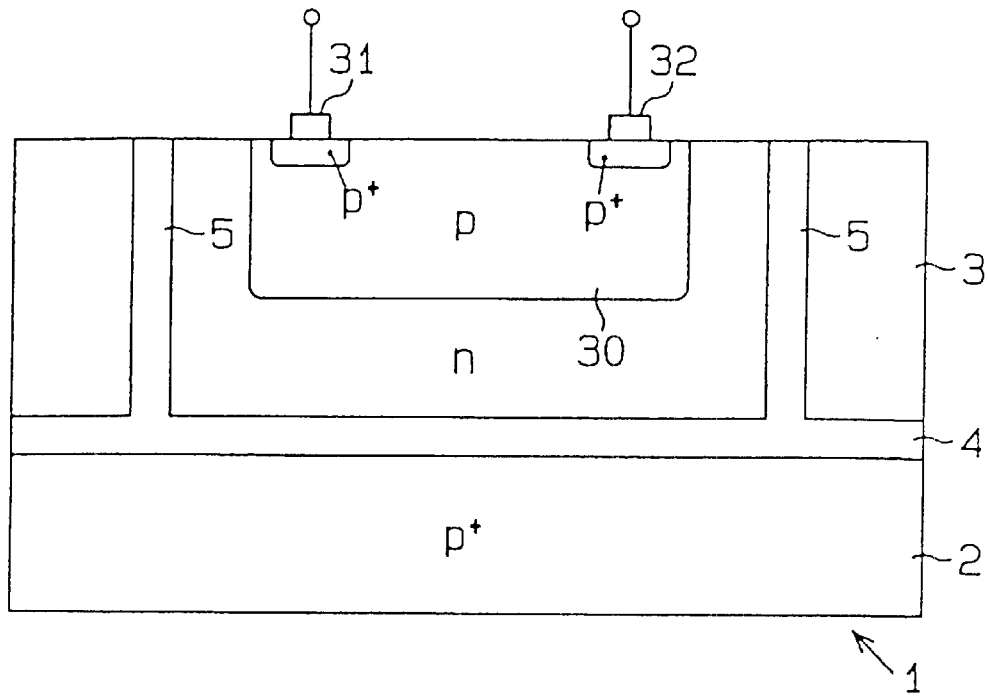
FIG. 4 is a cross-sectional view taken along a line B—B' of FIG. 2.
Figure 5:
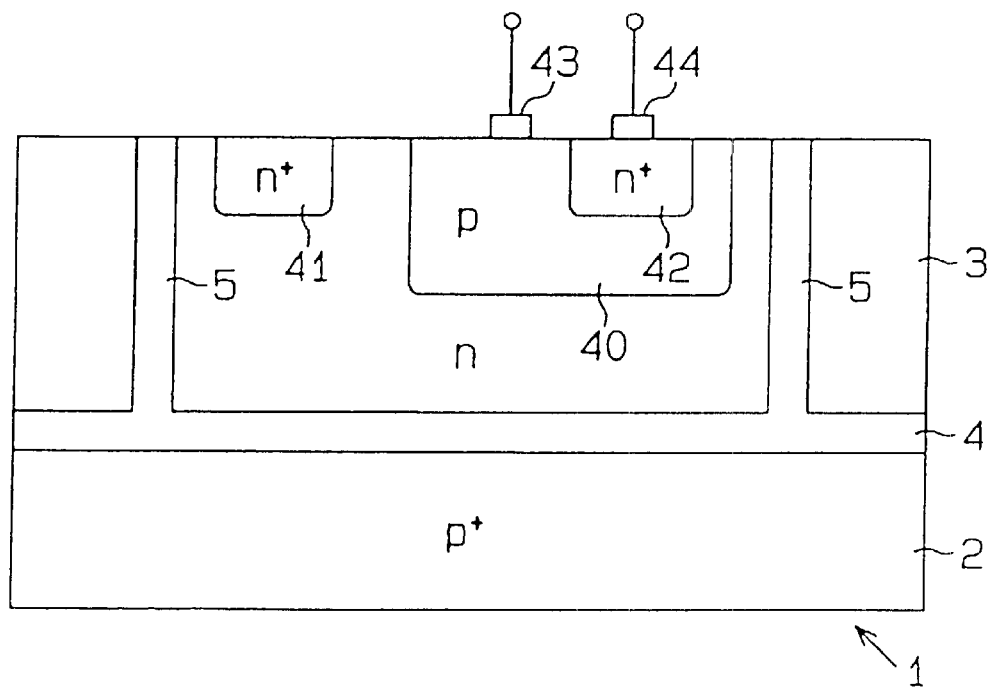
FIG. 5 is a cross-sectional view taken along a line C—C' of FIG. 2.

FIG. 2 is a plan view showing a silicon chip 1 serving as an actuating apparatus. FIG. 3 is a cross-sectional view taken along a line A—A' of FIG. 2, which shows an arrangement the power MOSFET 52. FIG. 4 is a cross-sectional view taken along a line B—B' of FIG. 2, and FIG. 5 is a cross-sectional view taken along a line C—C' of FIG. 2.

The semiconductor arrangement of this embodiment forms isolated bulk portions by utilizing the SOI (silicon-on-insulator) structure and the trench oxide film separating structure. As shown in FIGS. 4 and 5, a P$^+$ silicon substrate 2 and n-type silicon substrate 3 are bonded via an intervening silicon oxide film (i.e., embedded oxide film) layer 4 to form the SOI structure. A trench oxide film layer 5, forming a closed rectangular shape as shown in FIG. 2, is provided so as to vertically extend across the n-type silicon substrate 3 from the upper surface thereof to the embedded oxide film layer 4. A silicon region is thus formed as an isolated bulk portion enclosed by the trench oxide film layer 5 and the silicon oxide film (i.e., embedded oxide film) layer 4.

As shown in FIG. 3, a transistor forming isolated bulk portion forms an n-channel type, laterally double diffused power MOSFET. More specifically, a p-well region 9 is formed on a surface of the n-type silicon substrate 3. An n-well region 10 is formed in the p-well region 9. The p-well region 9 has a depth of approximately 4 $\mu$m. The n-well region 10 has a depth of approximately 1 $\mu$m. The p- and n-well regions 9 and 10, constituting a double diffusion structure, are formed by ion implanting boron (B) and arsenic (As) and using the thermal diffusion.

A plurality of LOCOS (localized oxidation of silicon) oxide film regions 11 are formed on the surface of the substrate as shown in FIG. 3. A polysilicon gate electrode 12 is disposed on each LOCOS oxide film region 11. A silicon oxide film 13, serving as a gate insulating film, is formed beneath the polysilicon gate electrode 12. The polysilicon gate electrodes 12 form a diffusion window for dosing boron (B) and arsenic (As) to form a double diffusion structure of a channel forming p-well region 14 and an $n^+$ source region 15. A $p^+$ region 16 is formed in the channel forming p-well region 14. An $n^+$ region 17 is formed on the surface of the n-well region 10.

As shown in FIG. 3, a BPSG (borophosphosilicate glass) film 18 is disposed extensively to cover the upper surface of the LOCOS oxide film 11 and the polysilicon gate electrode 12. A source electrode 19, made of aluminum, is overlapped on the BPSG film 18. The bottom of the source electrode 19 is separated from the BPSG film 18 and brought into contact with both of the $n^+$ source region 15 and the $p^+$ region 16. A drain electrode 20, made of aluminum, is overlapped on the BPSG film 18 at a region spaced from the source electrode 19. The bottom of the drain electrode 20 is separated from the BPSG film 18 and brought into contact with the $n^+$ region 17. The source electrode 19 and the drain electrode 20 cooperatively constitute a first aluminum layer. A second aluminum layer 22 is disposed on the first aluminum layer via a TEOS (tetraethyl orthosilicate) layer 21. The second aluminum layer 22 is covered by a silicon nitride film 23 serving as a passivation film.

When the transistor is turned on in response to an application of the gate voltage, drain current "Id" flows from the drain terminal toward the source terminal along the lower surface of the silicon oxide film 13 as indicated by an alternate long and two short dashes line as shown in FIG. 3. The silicon oxide film 13 serves as gate insulation film.

In FIG. 2, the p-well region 14 is referred to as a source cell 24 and the n-well region 10 is referred to as a drain cell 25. A plurality of source cells and a plurality of drain cells 25 are alternately disposed or arrayed in both lateral and longitudinal directions and integrated as a transistor forming isolated bulk portion at a predetermined portion of the silicon chip (i.e., semiconductor substrate) 1. The total number of the cells formed in the transistor forming isolated bulk portion is approximately 10,000. More specifically, as shown in FIG. 2, source cells 24 and drain cells 25 are alternately arranged in a square plane so as to form a so-called diced pattern.

As shown in FIG. 2, a single gate contact portion 26 is provided in the power MOSFET so as to be electrically connected to the polysilicon gate electrode 12 (refer to FIG. 3) via the second aluminum layer 22.

On the other hand, as shown in FIG. 1, the resistor 54 is interposed between the gate terminal of the power MOSFET 52 and the gate control unit 53. The resistor 54 has a resistance value of approximately 1 kΩ.

FIG. 4 shows the detailed arrangement of the resistor 54. A resistor forming isolated bulk portion is surrounded by the oxide film layers 4 and 5. A p-type base region 30 is formed in the resistor forming isolated bulk portion. Electrodes 31 and 32 are disposed on the upper surface of the p-type base region 30. In this manner, the resistor 54 is formed by the p-type base region. However, it is possible to use a thin-film resistor, such as a polysilicon resistor and a CrSi resistor, to form the resistor 54.

As shown in FIG. 1, a Zener diode group 55, consisting of a plurality of serially connected Zener diodes having the same characteristics, is connected between the drain terminal and the gate terminal (i.e., point α) of the power MOSFET 52. The Zener diode group 55 serves as a first Zener diode of the present invention. Each Zener diode of the Zener diode group 55 has a cathode directed toward the drain terminal of the power MOSFET 52 and an anode directed toward the gate terminal of the power MOSFET 52. The Zener diode group 55 causes breakdown in response to a surge voltage applied to the drain terminal of the power MOSFET 52.

The resistor 54, connected between the gate terminal of the power MOSFET 52 and the gate control unit 53, has a function of preventing current from flowing from the electric load 51 to the gate control unit 53 through the drain terminal of the MOSFET 52 in the event of the breakdown of the Zener diode group 55.

A Zener diode group 56, consisting of a plurality of serially connected Zener diodes having the same characteristics, is provided between the source terminal and the gate terminal (i.e., point α) of the power MOSFET 52. The Zener diode group 56 serves as a second Zener diode of the present invention. Each Zener diode of the Zener diode group 56 has a cathode directed toward the gate terminal and an anode directed toward the source terminal. The Zener diode group 56 has a breakdown voltage (i.e., withstand voltage) lower than a gate withstand voltage of the power MOSFET 52. The Zener diode group 56 has a function of clamping a gate voltage against the breakdown of the Zener diode group 55.

The load actuating circuit comprises a Zener diode 57 having one end connected to an intermediate point (β) between the gate control unit 53 and the resistor 54 and the other end connected to the source terminal of the power MOSFET 52. The Zener diode 57 has a cathode directed to the gate control unit 53 and an anode directed to the source terminal of the power MOSFET 52. The Zener diode 57 serves as a clamping Zener diode for holding the output voltage of the gate control unit 53 at an operation voltage of the MOSFET 52. A withstand voltage of the Zener diode 57 is equivalent to the gate driving voltage of the power MOSFET 52. A practical value of the power MOSFET 52 is approximately 7 volts. The Zener diode 57 causes breakdown when a surge voltage is applied from the gate control unit 53.

All of the Zener diodes constituting the Zener diode groups 55 and 56 and the Zener diode 57 are practically realized by the base-emitter construction of a minimum size NPN transistor. A breakdown voltage (i.e., withstand voltage) of the Zener diode is approximately 8.5 volts per stage.

More specifically, as shown in FIG. 5, a diode forming isolated bulk portion is surrounded by the oxide film layers 4 and 5. A P-type base region 40 and an $n^+$ type collector region 41 are formed in the diode forming isolated bulk portion. An $n^+$ type emitter region 42 is formed in the p-type base region 40. An electrode 43 is disposed on the upper surface of the P-type base region 40, an electrode 44 is disposed on the upper surface of the $n^+$ type emitter region 42. In this manner, each Zener diode is realized by the base-emitter construction of a minimum size NPN transistor.

A diode 58 is serially connected with the Zener diode group 55 and disposed between the drain and gate terminals of the power MOSFET 52. The diode 58 has a cathode directed to the gate terminal of the power MOSFET 52 and an anode directed to the drain terminal of the power MOSFET 52. The diode 58 has a function of preventing current from flowing from the gate terminal to the drain terminal when the power MOSFET 52 is tuned on. A withstand voltage of the diode 58 is higher than the gate driving voltage of the power MOSFET 52.

A diode 59 is serially connected with the Zener diode group 56 and disposed between the source and gate terminals of the power MOSFET 52. The diode 59 has a cathode directed to the source terminal of the power MOSFET 52 and an anode directed to the gate terminal of the power MOSFET 52. The anode of the diode 59 is connected to the gate control unit 53 via the Zener diode 57. The diode 59 has a function of preventing a positive noise from entering from the source terminal of the power MOSFET 52 to the gate control unit 53. A withstand voltage of the diode 59 is approximately 100 volts.

A body diode 60 is disposed between the source and drain terminals of the power MOSFET 52. This body diode 60 is a built-in diode D1 installed in the power MOSFET 52 as shown in FIG. 3, which is constituted by the $p^+$ region 16, the p-well region 14 and the n-well region 10.

Hereinafter, preferable stage numbers for the Zener diode groups 55 and 56 will be explained in detail.

The Zener diode group 55 comprises a plurality of serially connected Zener diodes between the drain and gate terminals of,the power MOSFET 52. The number of the required Zener diodes is determined considering the withstand voltage of each Zener diode.

More specifically, the Zener diode group 55 satisfies the following equation $$n = BVp/Vzd \text{ (ignore fractions)} \quad (1)$$

where "n" represents the total number of the Zener diodes constituting the Zener diode group 55, "BVp" represents an expected breakdown voltage of the power MOSFET 52, and "Vzd" represents a withstand voltage of one Zener diode constituting the Zener diode group. The expected breakdown voltage "BVp" is lower than a withstand voltage BVdds of the body diode 60.

Similarly, the Zener diode group 56 comprises a plurality of serially connected Zener diodes between the gate and source terminals of the power MOSFET 52. The Zener diode group 56 satisfies the following equation $$m = BVg/Vzd \text{ (ignore fractions)} \quad (2)$$

where "m" represents the total number of the Zener diodes constituting the Zener diode group 56, "BVg" represents the gate withstand voltage of the power MOSFET 52, and "Vzd" represents the withstand voltage of one Zener diode constituting the Zener diode group 56.

With this setting, the voltage between the gate and source terminals can be maintained at a level less than the gate withstand voltage even when a transient voltage is applied.

The resistor 54 is disposed between the output stage of the gate control unit 53 and the gate terminal of the power MOSFET 52. The gate terminal is the connecting point a where the drain-gate Zener diode group 55 and the gate-source Zener diode group 56 are connected. A resistance value Rg of the resistor 54 satisfies the following relationship $$Rg > \sqrt{r^2 + \left(\frac{1}{2\pi f C_{iss}}\right)^2} \quad (3)$$

where "r" represents a sheet resistance of the polysilicon gate electrode 12 of the power MOSFET 52, "f" represents a frequency at which a maximum spectrum intensity is obtained when an objective surge waveform is subjected to the Fourier transformation, and "Ciss" represents a gate input capacitance of the power MOSFET to be protected.

In short, the resistance Rg is larger than a gate input impedance of the power MOSFET 52 when the objective surge voltage is applied. For example, the resistance Rg is approximately 200 Ω when the sheet resistance "r" is 30 (Ω/□), the frequency "f" is 10 MHz and the gate input capacitance "Ciss" is 100 pF.

Figure 6:
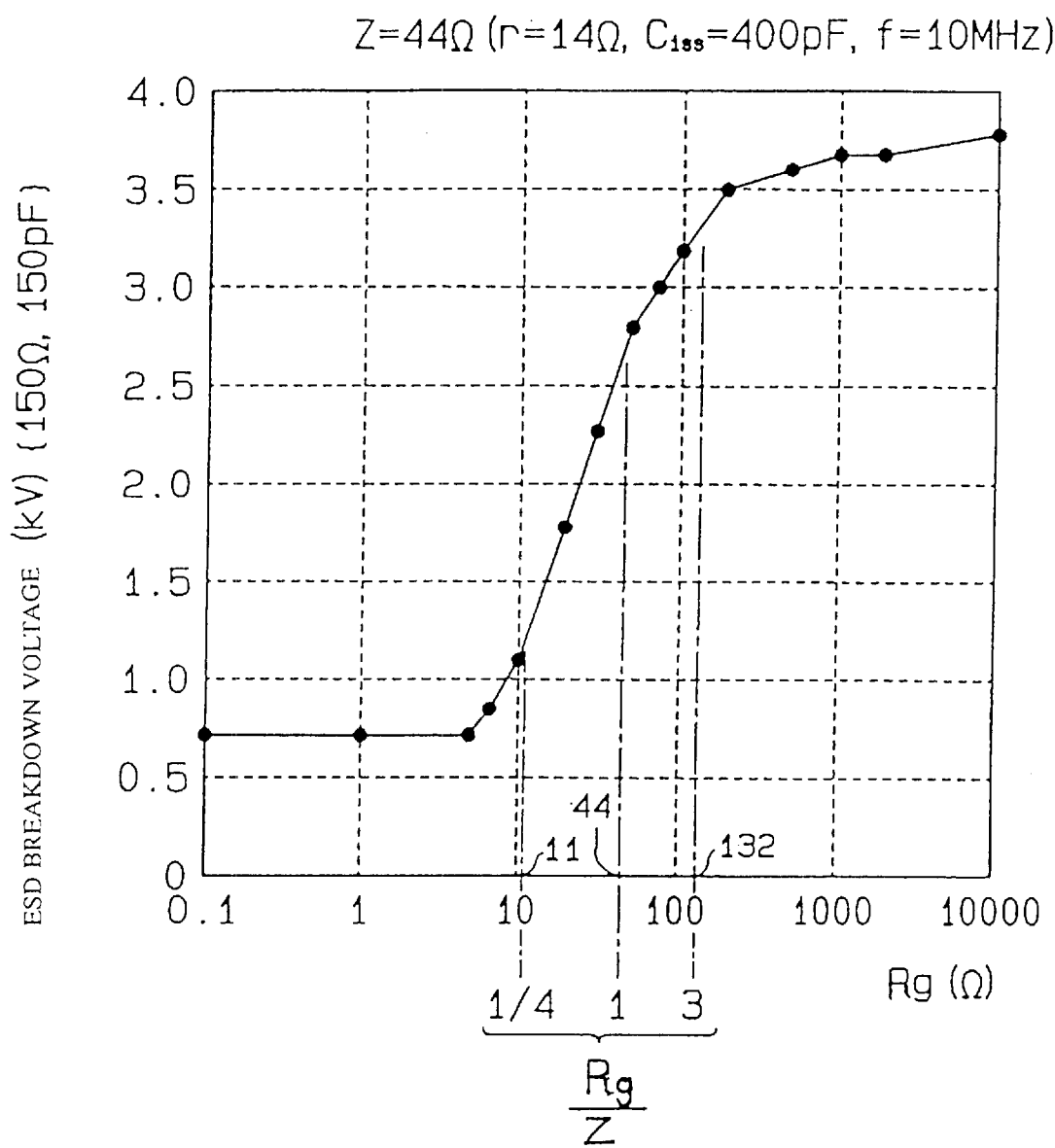
FIG. 6 is a graph showing the measuring result of an ESD breakdown voltage.
Figure 7:
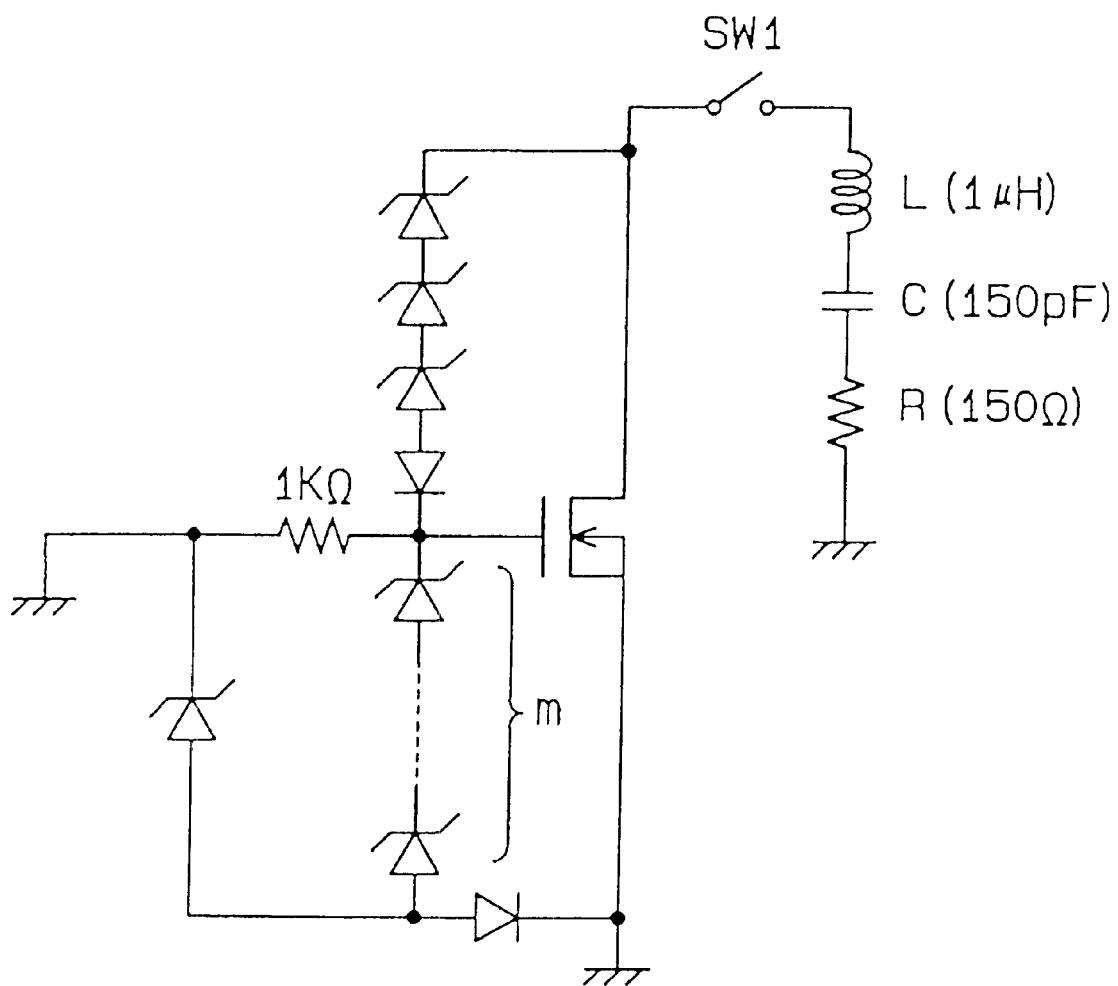
FIG. 7 is a diagram illustrating a simulation model.

FIG. 6 is a graph showing a relationship between an ESD (electrostatic discharge) breakdown voltage and the resistance value Rg of the resistor 54 obtained in the ESD measuring test wherein the gate input impedance "Z" of the power MOSFET 52 is fixed to 44 Ω (Z=44Ω). In FIG. 6, an abscissa axis represents the resistance value Rg of the resistor 54 and an ordinate axis represents an ESD breakdown voltage. A discharge resistance is 150 Ω and a discharge capacitance is 150 pF. These test conditions correspond to the electrostatic test for an ECU (i.e., electronic control unit) of an automotive vehicle.

A reference ratio Rg/Z is shown together with the abscissa axis in FIG. 6. The reference ratio Rg/Z represents a ratio of the resistance value Rg of the resistor 54 to the gate input impedance "Z" of the power MOSFET 52.

According to the measuring result shown in FIG. 6:

(I) the breakdown voltage starts increasing when the resistance value Rg reaches a critical value equivalent to a quarter of the gate input impedance "Z";

(II) the breakdown voltage smoothly increases in accordance with increase of the resistance value Rg and reaches a significant large value when the resistance value Rg is equal to the gate input impedance "Z"; and (III) the breakdown voltage is substantially saturated when the resistance value is increased to the three times the gate input impedance "Z".

From the foregoing, it is preferable that the resistor 54 satisfies the following conditions.

As apparent from the above result (I), the primary condition is that the resistance value Rg is equal to or larger than a quarter of the gate input impedance "Z" of the power MOSFET 52. With this setting, the durability against the surge voltage can be improved.

Then, as apparent from the above result (II), the secondary condition added to the above primary condition is that the resistance value Rg satisfies the above-described relationship (3). With this additional setting, the resistance value Rg can be set to an appropriate level.

Furthermore, as apparent from the above result (III), the third condition to be further added is that the resistance value Rg is equal to or larger than three times the gate input impedance "Z" of the power MOSFET 52. With this additional setting, the resistance value Rg becomes more appropriate.

Next, the function of the above-described surge protecting circuit for an insulated gate type transistor will be explained.

It is now assumed that a positive surge is applied to the drain terminal under the condition that the power MOSFET 52 is turned off.

When an electrostatic surge is applied to the drain terminal, the drain-gate Zener diode group 55 causes breakdown before the power MOSFET 52 is turned on. This breakdown makes current flow into the gate terminal of the power MOSFET 52.

Then, the gate potential increases in accordance with the progress of charging operation of the gate input capacitor charged by the breakdown current flowing into the gate terminal. In this case, the resistor 54 prevents the breakdown current from flowing into the gate control unit 53 because the resistance value Rg of the resistor 54 is larger than the gate input impedance "Z" of the power MOSFET 52 as shown in the relationship (3). Thus, the charging operation of the gate input capacitor is quickly accomplished.

Then, when the gate input voltage reaches a threshold "Vth" of the power MOSFET 52, the MOSFET 52 turns on to allow the surge current to flow from the drain terminal (i.e., electric load 51) to the source (i.e., ground) terminal via an inside portion of the power MOSFET 52.

Figure 8:
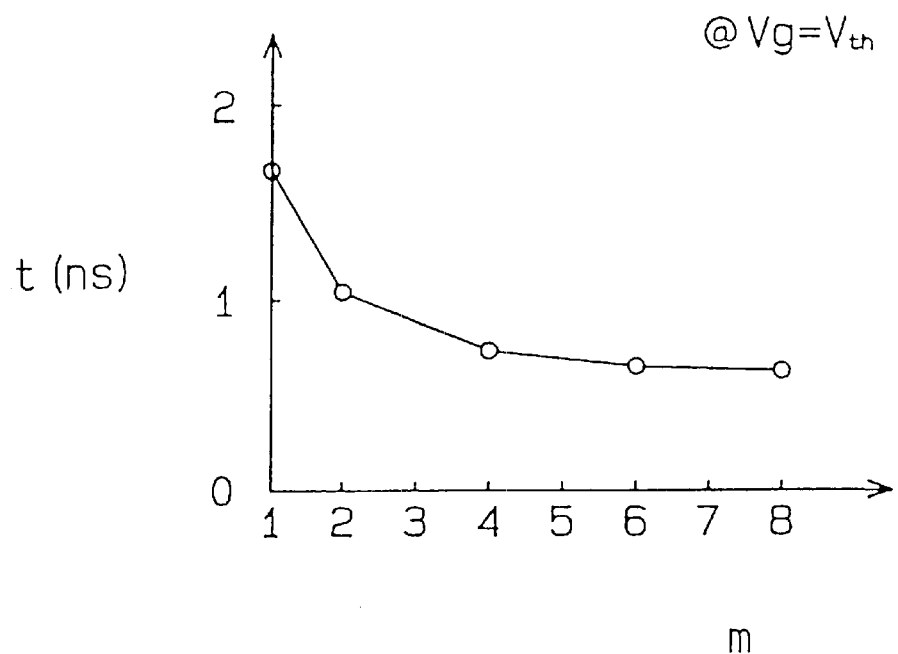
FIG. 8 is a graph showing a relationship between a gate charging time and the number of stages of a gate-source Zener diode.
Figure 9:
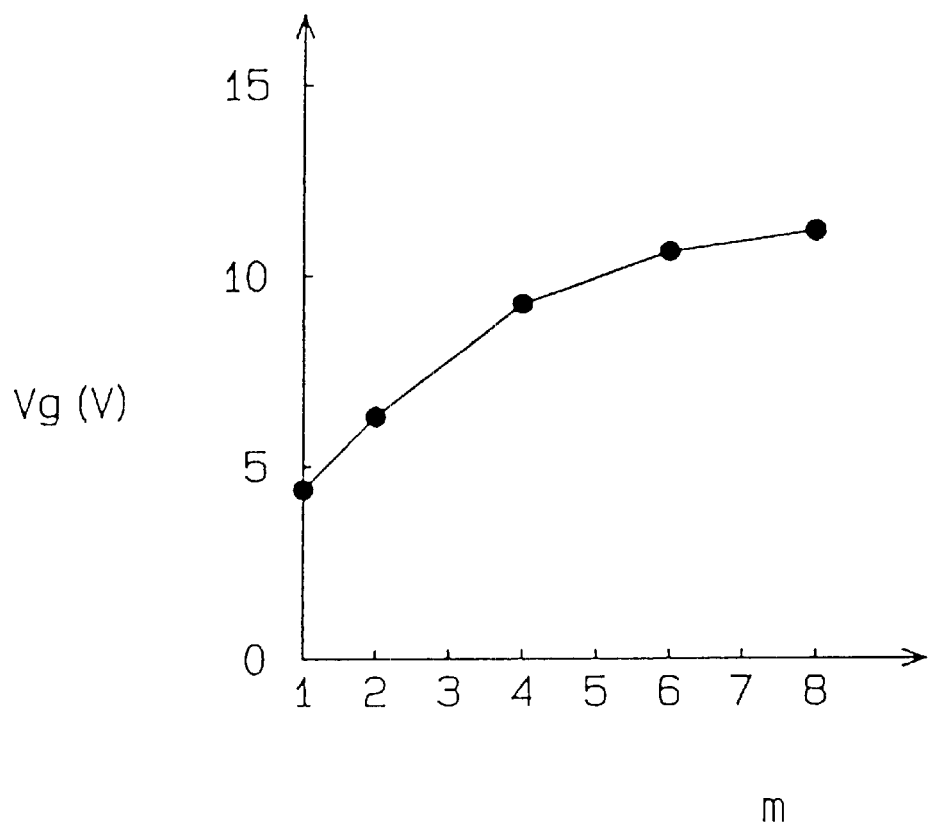
FIG. 9 is a graph showing a relationship between a maximum gate voltage and the number of stages of the gate-source Zener diode.

FIGS. 8 and 9 show the circuit simulation result.

FIG. 8 shows a relationship between the total number "m" of the gate-source Zener diode group 56 and the time "t" required for the gate voltage reaching to the threshold Vth. As apparent from FIG. 8, the speed of the gate voltage Vg reaching to the threshold Vth increases with increasing stage number "m."

FIG. 9 shows a relationship between the total number "m" of the gate-source Zener diode group 56 and the gate voltage Vg. The discharge conditions used in this case are C=150 pF, R=150 Ω and L=1 μH.

It is understood from FIG. 8 that it takes approximately 1 nanosecond for the power MOSFET 52 to turn on after the current flows through the Zener diode group 55. In other words, the charging operation through the gate terminal is accomplished quickly. Within approximately 1 nanosecond, the surge current starts flowing via the inside portion of the power MOSFET 52.

In this manner, the above-described embodiment of the present invention makes it possible to shorten the gate charging time so that the power MOSFET 52 is turned to flow the surge current within a short time compared with the electrostatic discharge time. The surge current flowing through the inside portion of the power MOSFET 52 surely eliminates the parasitic bipolar transistor Tr1 shown in FIG. 3. Thus, it becomes possible to improve the durability against the quick surge caused by the static electricity or the like.

The drain saturation current of the power MOSFET 52 increases with increasing gate voltage. The higher drain saturation current is advantageous in that the surge current easily flows. The surge durability can be increased.

The relationship between the drain current Id, the gate voltage Vg and the threshold voltage Vth is expressed in the following manner.

$$Id \propto (Vg-Vth)^2$$

According to this relationship, the drain saturation current increases with increasing gate voltage Vg. A great amount of surge current flows when the drain saturation current is high.

However, there is the possibility that an excessively high gate voltage may damage the gate oxide film. To avoid such damages, the stage number (i.e., total number) of the Zener diodes constituting the gate-source Zener diode group 56 is regulated by the above-described equation (2). Through this regulation, the gate voltage can be clamped to a value equal to mVzd. This prevents the gate oxide film 13 from being damaged. In other words, it becomes possible to maximize the surge durability without damaging the gate oxide film 13.

Namely, in the comparative surge preventing circuit shown in FIG. 13, the Zener diode 101 is used to clamp the gate voltage at an ordinary actuation voltage. On the other hand, the Zener diode 57 shown in FIG. 1 clamps the gate voltage at a lower voltage during an ordinary operation and the Zener diode group 56 clamps the gate voltage at a higher voltage in the event of application of the surge voltage. The drain saturated current during the application of the surge voltage is increased so as to improve the surge durability.

As described above, the preferred embodiment of the present invention provides the surge preventing circuit having the following characteristics.

<1> As shown in FIG. 1, the Zener diode group 55 serving as the first Zener diode of the present invention is connected between the drain (i.e., high-voltage) terminal and the gate terminal of the power MOSFET 52. The Zener diode group 55 causes breakdown in response to a surge voltage applied to the drain terminal which is connected to the electric load 51. The resistor 54 is connected between the gate terminal of the power MOSFET 52 and the gate control unit 53. The resistor 54 prevents the current from flowing from the electric load 51 to the gate control unit 53 through the drain terminal of the power MOSFET 52 in an event of the breakdown of the Zener diode group 55. And, the Zener diode group 56 serving as the second Zener diode of the present invention is connected between the source (i.e., low-voltage) terminal and the gate terminal of the power MOSFET 52. A breakdown voltage of the Zener diode group 56 is lower than the gate withstand voltage of the power MOSFET 52. The Zener diode group 56 clamps the gate voltage against the breakdown of the Zener diode group 55.

Accordingly, the Zener diode group 55 causes breakdown when a surge voltage is applied to the drain terminal of the power MOSFET 52 which is connected to the electric load 51. The resistor 54 prevents the current from flowing from the electric load 51 to the gate control unit 53 via the drain terminal of the power MOSFET 52 and the Zener diode group 55. The gate terminal is charged. When the gate voltage is increased to the threshold voltage of the power MOSFET 52, the power MOSFET 52 is turned on. The surge current starts flowing from the drain terminal (i.e., from the electric load 51) to the source terminal (i.e., ground) through the inside portion of the power MOSFET 52. Thus, the power MOSFET 52 is protected against the surge voltage.

By providing the Zener diode group 56 of multiple stage between the gate and source terminals of the power MOSFET 52, it becomes possible to quicken the charging operation through the gate terminal. Quick accomplishment of the gate charging operation makes the power MOSFET 52 turn on quickly. The surge current flows at an early timing so as to suppress the undesirable parasitic bipolar operation.

Thus, it becomes possible to improve the durability against the quick surge caused by static electricity or the like.

<2> There is provided the third Zener diode 57 having one end connected the intermediate point (β) between the gate control unit 53 and the resistor 54 and the other end connected to the source terminal of the power MOSFET 52. The third Zener diode 57 causes breakdown when a surge voltage is applied from the gate control unit 53. The surge current flows from the gate control unit 53 to the source terminal, thereby protecting the gate terminal of the power MOSFET 52.

<3> It is practically preferable that the Zener diode group 55 consists of a plurality of serially connected Zener diodes having the same characteristics. And, the following equation is satisfied for the Zener diode group 55.

$$n = BVp/Vzd$$

where "n" represents the total number of the Zener diodes constituting the Zener diode group 55, "BVp" represents an expected breakdown voltage of the power MOSFET 52, and "Vzd" represents a withstand voltage of one diode constituting the Zener diode group 55.

<4> It is practically preferable that the Zener diode group 56 consists of a plurality of serially connected Zener diodes having the same characteristics. And, the following equation is satisfied for the Zener diode group 56.

$$m = BVg/Vzd$$

where "m" represents the total number of the Zener diodes constituting the second Zener diode group 56, "BVg" represents the gate withstand voltage of the power MOSFET 52, and "Vzd" represents a withstand voltage of one diode constituting the Zener diode group 56.

<5> It is further preferable that the resistor 54 connected between the gate terminal of the power MOSFET 52 and the gate control unit 53 has the resistance value Rg satisfying the following relationship $$Rg > \sqrt{r^2 + \left(\frac{1}{2\pi f C_{iss}}\right)^2}$$

where "r" represents the sheet resistance of the polysilicon gate electrode 12 of the power MOSFET 52, "f" represents the frequency at which the maximum spectrum intensity is obtained when the objective surge waveform is subjected to the Fourier transformation, and "Ciss" represents the gate input capacitance of the power MOSFET 52 to be protected.

<6> It is also preferable that the resistor 54 connected between the gate terminal of the power MOSFET 52 and the gate control unit 53 has the resistance value larger than a quarter of the gate input impedance of the power MOSFET 52 when the objective surge is applied.

Figure 10:
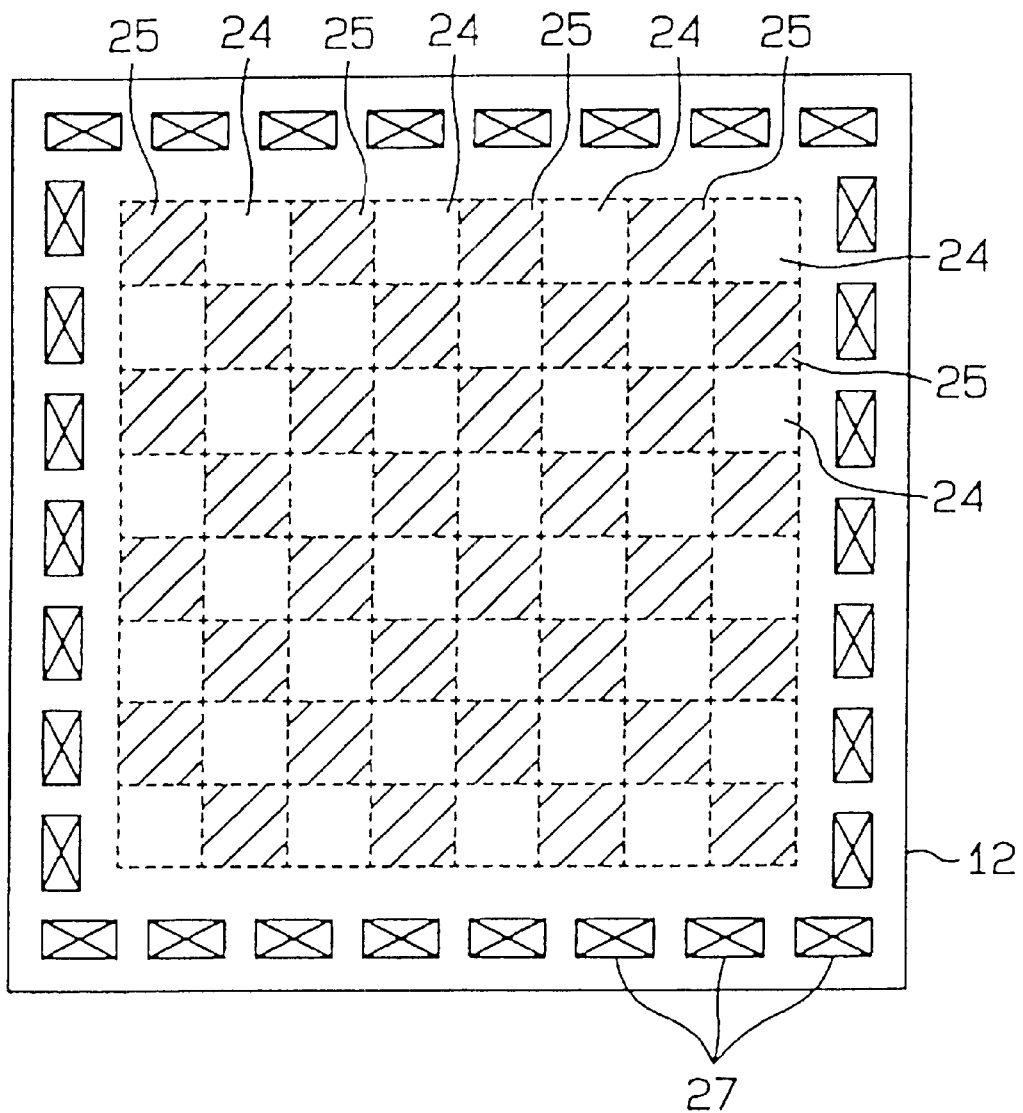
FIG. 10 is a plan view showing another power MOSFET.

FIG. 10 shows a surge preventing circuit in accordance with another embodiment of the present invention.

As shown in FIG. 10, a plurality of gate contact portions 27 are provided at predetermined intervals around the transistor forming isolated bulk portion. Each gate contact portion 27 is electrically connected to the gate electrode 12. This arrangement is advantageous to reduce the gate input impedance of the power MOSFET 52. In other words, it becomes possible to reduce the overall resistance of the gate wiring required for the transistor forming isolated bulk portion. Furthermore, it becomes possible to provide a uniform wiring arrangement for each gate electrode 12 having substantially the same resistance value. With this arrangement, the gate charging operation is accomplished quickly at a speed faster than that of the surge. The surge durability can be improved. The gate input resistance can be reduced. It is also possible to suppress the reduction of the switching speed in an ordinary operation.

As described above, the resistance value of the gate portion can be reduced by providing numerous gate contact portions 27 along the periphery of the transistor forming isolated bulk portion on the semiconductor substrate 1.

The present invention is not limited to the above-described surge preventing circuit which is constituted based on the LDMOSFET (i.e., laterally double diffused MOSFET). It is therefore possible to replace the LDMOSFET with a VDMOSFET (vertically double diffused MOSFET).

Figure 11:
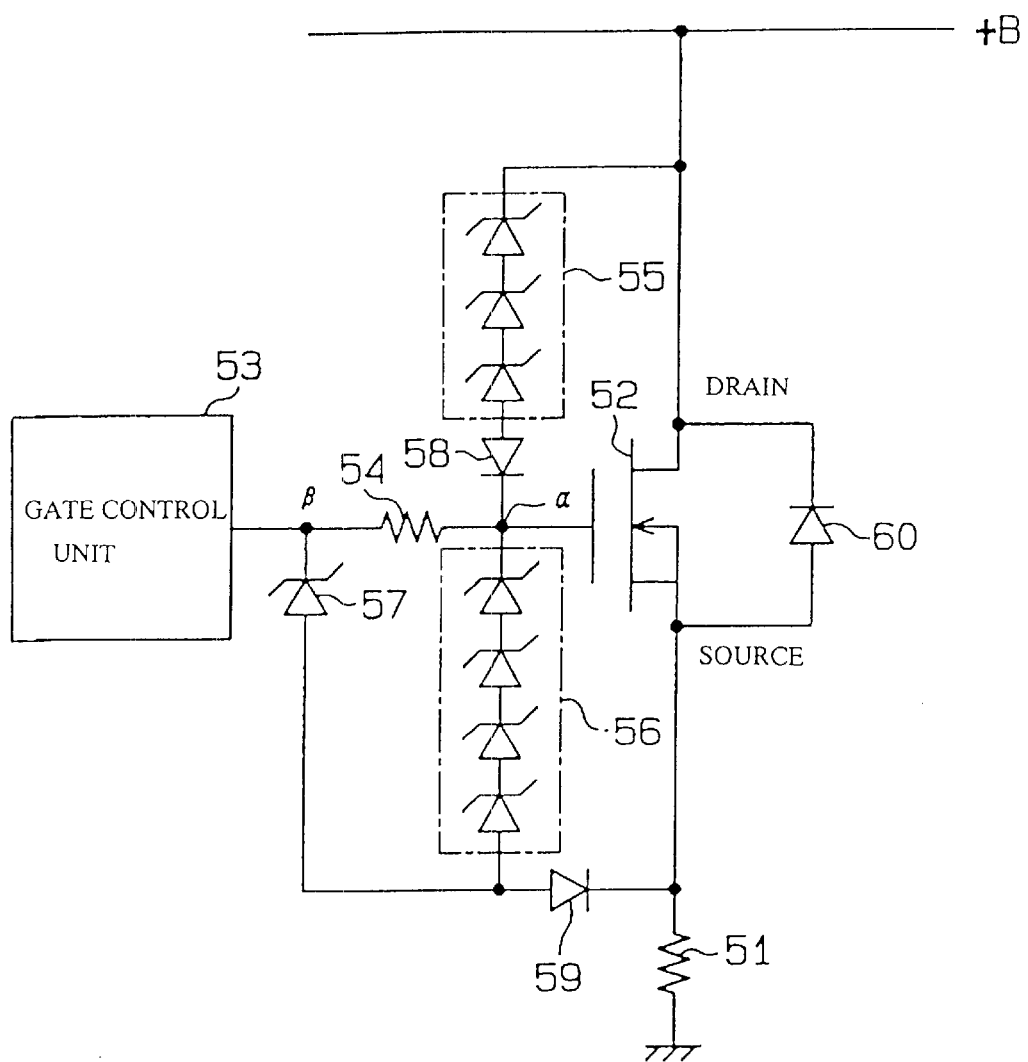
FIG. 11 is a diagram showing a load actuating circuit in accordance with another preferred embodiment of the present invention.

Regarding the connection between the transistor and the electric load, it is possible to connect the electric load to the lower-voltage terminal of the transistor instead of connecting the electric load to the higher-voltage terminal as shown in FIG. 11.

More specifically, in FIG. 11, the electric load 51 is connected between the source terminal of the N-channel MOSFET 52 and the ground. The Zener diode group (i.e., first Zener diode) 55 causes breakdown in response to an application of the surge voltage (i.e., power source surge application) from the high-voltage terminal. The Zener diode group (i.e., second Zener diode of multiple stage) 56 has a breakdown voltage lower than the gate withstand voltage of the power MOSFET 52. The Zener diode group 56 clamps the gate voltage against the breakdown of the Zener diode group 55. Furthermore, the Zener diode (i.e., third Zener diode) 57 clamps the surge voltage applied from the gate control unit 53.

When a negative surge is applied to the source terminal of the power MOSFET 52, the p-well potential is reduced relative to the gate potential. Thus, the power MOSFET 52 is turned on. In this case, the Zener diode group 56 interposed between the gate and source terminals prevents the gate from being damaged.

Figure 12:
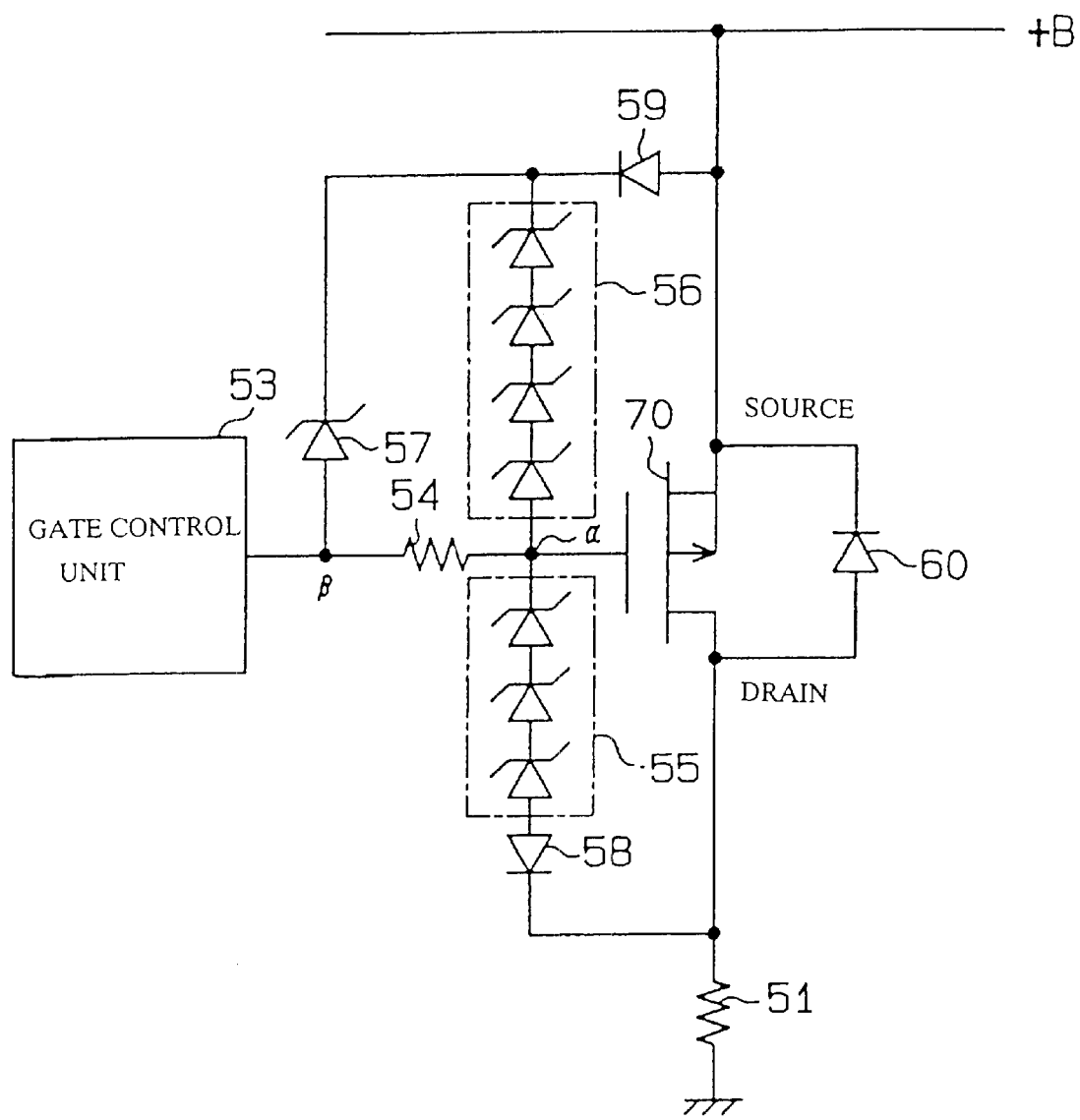
FIG. 12 is a diagram showing a load actuating circuit in accordance with another preferred embodiment of the present invention.

FIG. 12 shows a load actuating circuit based on a p-channel power MOSFET 70. As shown in FIG. 12, the electric load 51 is connected to the drain terminal of the p-channel power MOSFET 70. The drain-gate Zener diode group (i.e., first Zener diode) 55 is connected between the drain and gate terminals of the power MOSFET 70. The gate-source Zener diode group (i.e., second Zener diode of multiple stage) 56 is connected between the gate and source terminals of the power MOSFET 70. Furthermore, the Zener diode (i.e., third Zener diode) 57 is provided to clamp the surge voltage applied from the gate control unit 53. The Zener diode group 55 causes breakdown in response to an application of a negative surge voltage applied to the low-voltage terminal. The resistor 54 prevents the current from flowing from the lower-voltage terminal of the power MOSFET 70 to the gate control circuit 53. The gate charging operation is promoted to turn on the power MOSFET 70. The surge current starts flowing from the high-voltage terminal to the low-voltage terminal through the inside portion of the MOSFET 70. Thus, the power MOSFET 70 is protected from the surge.

A breakdown voltage of the Zener diode group (i.e., second Zener diode of multiple stage) 56 is lower than the gate withstand voltage of the power MOSFET 70. The Zener diode group 56 clamps the gate voltage against the breakdown of the Zener diode group 55. In this manner, the drain-gate Zener diode 55 causes the breakdown in response to the negative surge applied to the drain terminal. The power MOSFET 70 is turned on due to the negative bias of the gate terminal. The turning-on operation of the power MOSFET 70 is quickly accomplished when the stage number (i.e., total number) of the gate-source Zener diode group 56 is sufficiently large. Furthermore, the Zener diode (i.e., the third Zener diode) 57 causes the breakdown in response to an application of the surge voltage from the gate control unit 53 at an earlier timing so that the surge current flows to the high-voltage terminal. Thus, the gate is protected from the surge.

The present invention can be applicable to other insulated gate type transistor, such as IGBT (insulated gate bipolar transistor), as well as the MOSFET.

This invention may be embodied in several forms without departing from the spirit of essential characteristics thereof. The present embodiments as described are therefore intended to be only illustrative and not restrictive, since the scope of the invention is defined by the appended claims rather than by the description preceding them. All changes that fall within the metes and bounds of the claims, or equivalents of such metes and bounds, are therefore intended to be embraced by the claims.

What is claimed is:

1. A surge preventing circuit for an insulated gate type transistor with high-voltage and low-voltage terminals, one of which is connected to an electric load, and a gate terminal connected to a gate control unit, said surge preventing circuit comprising:

a first Zener diode having one end connected to said electric load through said one of high-voltage and low-voltage terminals and the other end connected to said gate terminal of said insulated gate type transistor, for causing breakdown in response to a surge voltage applied to said one of the high-voltage and low-voltage terminals which is connected to the electric load;

a resistor connected between said gate terminal of said insulated gate type transistor and said gate control unit, for preventing current from flowing from said one of high-voltage and low-voltage terminals of the insulated gate type transistor to said gate control unit in an event of the breakdown of the first Zener diode;

a second Zener diode of multiple stages connected between the other of said high-voltage and low-voltage terminals and said gate terminal of said insulated gate type transistor, for clamping a gate voltage against the breakdown of the first Zener diode, said second Zener diode having a breakdown voltage lower than a gate withstand voltage of said insulated gate type transistor; and a diode serially connected with said second Zener diode and disposed between the gate terminal and the other of said high-voltage and low-voltage terminals of said insulated gate type transistor, for preventing a surge voltage from entering from the other of said high-voltage and low-voltage terminals into the gate terminal of said insulated gate type transistor and into the gate control unit.

2. The surge preventing circuit for an insulated gate type transistor in accordance with claim 1, further comprising a third Zener diode having one end connected to an intermediate point between said gate control unit and said resistor and the other end connected to said other of said high-voltage and low-voltage terminals of said insulated gate type transistor.

3. A surge preventing circuit for an insulated gate type transistor with high-voltage and low-voltage terminals, one of which is connected to an electric load, and a gate terminal connected to a gate control unit, said surge preventing circuit comprising:

a first Zener diode having one end connected to said electric load through said one of high-voltage and low-voltage terminals and the other end connected to said gate terminal of said insulated gate type transistor, for causing breakdown in response to a surge voltage applied to said one of the high-voltage and low-voltage terminals which is connected to the electric load;

a resistor connected between said gate terminal of said insulated gate type transistor and said gate control unit, for preventing current from flowing from said one of high-voltage and low-voltage terminals of the insulated gate type transistor to said gate control unit in an event of the breakdown of the first Zener diode; and a second Zener diode of multiple stages connected between the other of said high-voltage and low-voltage terminals and said gate terminal of said insulated gate type transistor, for clamping a gate voltage against the breakdown of the first Zener diode, said second Zener diode having a breakdown voltage lower than a gate withstand voltage of said insulated gate type transistor, wherein said first Zener diode is a Zener diode group consisting of a plurality of serially connected Zener diodes having the same characteristics, which satisfies the following equation $$n = BVp/Vzd$$

where "n" represents the total number of the Zener diodes constituting said Zener diode group, "BVp" represents an expected breakdown voltage of said insulated gate type transistor, and "Vzd" represents a withstand voltage of one Zener diode constituting said Zener diode group.

4. A surge preventing circuit for an insulated gate type transistor with high-voltage and low-voltage terminals, one of which is connected to an electric load, and a gate terminal connected to a gate control unit, said surge preventing circuit comprising:

a first Zener diode having one end connected to said electric load through said one of high-voltage and low-voltage terminals and the other end connected to said gate terminal of said insulated gate type transistor, for causing breakdown in response to a surge voltage applied to said one of the high-voltage and low-voltage terminals which is connected to the electric load;

a resistor connected between said gate terminal of said insulated gate type transistor and said gate control unit, for preventing current from flowing from said one of high-voltage and low-voltage terminals of the insulated gate type transistor to said gate control unit in an event of the breakdown of the first Zener diode; and a second Zener diode of multiple stages connected between the other of said high-voltage and low-voltage terminals and said gate terminal of said insulated gate type transistor, for clamping a gate voltage against the breakdown of the first Zener diode, said second Zener diode having a breakdown voltage lower than a gate withstand voltage of said insulated gate type transistor, wherein said second Zener diode is a Zener diode group consisting of a plurality of serially connected Zener diodes having the same characteristics, which satisfies the following equation $$m = BVg/Vzd$$

where "m" represents the total number of the Zener diodes constituting said Zener diode group, "BVg" represents an expected breakdown voltage of said insulated gate type transistor, and "Vzd" represents a withstand voltage of one Zener diode constituting said Zener diode group.

5. A surge preventing circuit for an insulated gate type transistor with high-voltage and low-voltage terminals, one of which is connected to an electric load, and a gate terminal connected to a gate control unit, said surge preventing circuit comprising:

a first Zener diode having one end connected to said electric load through said one of high-voltage and low-voltage terminals and the other end connected to said gate terminal of said insulated gate type transistor, for causing breakdown in response to a surge voltage applied to said one of the high-voltage and low-voltage terminals which is connected to the electric load;

a resistor connected between said gate terminal of said insulated gate type transistor and said gate control unit, for preventing current from flowing from said one of high-voltage and low-voltage terminals of the insulated gate type transistor to said gate control unit in an event of the breakdown of the first Zener diode; and a second Zener diode of multiple stages connected between the other of said high-voltage and low-voltage terminals and said gate terminal of said insulated gate type transistor, for clamping a gate voltage against the breakdown of the first Zener diode, said second Zener diode having a breakdown voltage lower than a gate withstand voltage of said insulated gate type transistor, wherein said resistor connected between said gate terminal of said insulated gate type transistor and said gate control unit has a resistance value Rg satisfying the following relationship $$Rg > \sqrt{r^2 + \left(\frac{1}{2\pi f C_{iss}}\right)^2}$$

where "r" represents a sheet resistance of the gate terminal of said insulated gate type transistor, "f" represents a frequency at which a maximum spectrum intensity is obtained when an objective surge waveform is subjected to the Fourier transformation, and "$C_{iss}$" represents a gate input capacitance of said insulated gate type transistor.

6. The surge preventing circuit for an insulated gate type transistor in accordance with claim 1, wherein said resistor connected between said gate terminal of said insulated gate type transistor and said gate control unit has a resistance value larger than a quarter of a gate input impedance of said insulated gate type transistor when an objective surge is applied.

7. The surge preventing circuit for an insulated gate type transistor in accordance with claim 3, further comprising a third Zener diode having one end connected to an intermediate point between said gate control unit and said resistor and the other end connected to said other of said high-voltage and low-voltage terminals of said insulated gate type transistor.

8. The surge preventing circuit for an insulated gate type transistor in accordance with claim 3, wherein said second Zener diode is a Zener diode group consisting of a plurality of serially connected Zener diodes having the same characteristics, which satisfies the following equation m=BVg/Vzd where "m" represents the total number of the Zener diodes constituting said Zener diode group, "BVg" represents an expected breakdown voltage of said insulated gate type transistor, and "Vzd" represents a withstand voltage of one Zener diode constituting said Zener diode group.

9. The surge preventing circuit for an insulated gate type transistor in accordance with claim 3, wherein said resistor connected between said gate terminal of said insulated gate type transistor and said gate control unit has a resistance value Rg satisfying the following relationship $$Rg > \sqrt{r^2 + \left(\frac{1}{2\pi f C_{iss}}\right)^2}$$

where "r" represents a sheet resistance of the gate terminal of said insulated gate type transistor, "f" represents a frequency at which a maximum spectrum intensity is obtained when an objective surge waveform is subjected to the Fourier transformation, and "$C_{iss}$" represents a gate input capacitance of said insulated gate type transistor.

10. The surge preventing circuit for an insulated gate type transistor in accordance with claim 3, wherein said resistor connected between said gate terminal of said insulated gate type transistor and said gate control unit has a resistance value larger than a quarter of a gate input impedance of said insulated gate type transistor when an objective surge is applied.

11. The surge preventing circuit for an insulated gate type transistor in accordance with claim 4, further comprising a third Zener diode having one end connected to an intermediate point between said gate control unit and said resistor and the other end connected to said other of said high-voltage and low-voltage terminals of said insulated gate type transistor.

12. The surge preventing circuit for an insulated gate type transistor in accordance with claim 4, wherein said resistor connected between said gate terminal of said insulated gate type transistor and said gate control unit has a resistance value Rg satisfying the following relationship $$Rg > \sqrt{r^2 + \left(\frac{1}{2\pi f C_{iss}}\right)^2}$$

where "r" represents a sheet resistance of the gate terminal of said insulated gate type transistor, "f" represents a frequency at which a maximum spectrum intensity is obtained when an objective surge waveform is subjected to the Fourier transformation, and "$C_{iss}$" represents a gate input capacitance of said insulated gate type transistor.

13. The surge preventing circuit for an insulated gate type transistor in accordance with claim 4, wherein said resistor connected between said gate terminal of said insulated gate type transistor and said gate control unit has a resistance value larger than a quarter of a gate input impedance of said insulated gate type transistor when an objective surge is applied.

14. The surge preventing circuit for an insulated gate type transistor in accordance with claim 5, further comprising a third Zener diode having one end connected to an intermediate point between said gate control unit and said resistor and the other end connected to said other of said high-voltage and low-voltage terminals of said insulated gate type transistor.

15. The surge preventing circuit for an insulated gate type transistor in accordance with claim 5, wherein said resistor connected between said gate terminal of said insulated gate type transistor and said gate control unit has a resistance value larger than a quarter of a gate input impedance of said insulated gate type transistor when an objective surge is applied.

* * * * *

UNITED STATES PATENT AND TRADEMARK OFFICE
CERTIFICATE OF CORRECTION

PATENT NO. : 6,385,028 B1
DATED : May 7, 2002
INVENTOR(S) : Kenji Kouno

It is certified that error appears in the above-identified patent and that said Letters Patent is hereby corrected as shown below:

<u>Column 15,</u>
Line 26, "f" should be -- $f$ --

<u>Column 16,</u>
Line 7, "f" should be -- $f$ --
Line 39, "f" should be -- $f$ --

Signed and Sealed this

Fifth Day of November, 2002

*Attest:*

*Attesting Officer*

JAMES E. ROGAN
*Director of the United States Patent and Trademark Office*